United States Patent
Behringer

(10) Patent No.: US 9,885,741 B2
(45) Date of Patent: Feb. 6, 2018

(54) METHOD FOR DETERMINING THE SUPPLY VOLTAGES OF A LOAD, AND LOAD

(71) Applicant: SIEMENS AKTIENGESELLSCHAFT, München (DE)

(72) Inventor: Klaus Behringer, Igensdorf (DE)

(73) Assignee: SIEMENS AKTIEGESELLSCHAFT, München (DE)

( * ) Notice: Subject to any disclaimer, the term of this patent is extended or adjusted under 35 U.S.C. 154(b) by 48 days.

(21) Appl. No.: 15/103,360

(22) PCT Filed: Dec. 3, 2014

(86) PCT No.: PCT/EP2014/076438
§ 371 (c)(1),
(2) Date: Jun. 10, 2016

(87) PCT Pub. No.: WO2015/086408
PCT Pub. Date: Jun. 18, 2015

(65) Prior Publication Data
US 2016/0313381 A1  Oct. 27, 2016

(30) Foreign Application Priority Data
Dec. 13, 2013 (EP) ..................................... 13197203

(51) Int. Cl.
*G01R 21/06* (2006.01)
*G01R 19/00* (2006.01)
(Continued)

(52) U.S. Cl.
CPC ......... *G01R 21/06* (2013.01); *G01R 19/2513* (2013.01); *G01R 15/144* (2013.01);
(Continued)

(58) Field of Classification Search
CPC ........ G01R 21/00; G01R 21/06; G01R 19/00; G01R 19/0084; G01R 19/0092;
(Continued)

(56) References Cited

U.S. PATENT DOCUMENTS 6,515,446 B1 *  2/2003  Koide ................... B60L 3/0038
                                                   318/700
8,552,701 B2 * 10/2013  Navarro ................ H02J 3/1878
                                                   323/282
(Continued)

FOREIGN PATENT DOCUMENTS

AU    2003/204811 A1    8/2004

OTHER PUBLICATIONS

Fang Zheng Peng et al; Generalized Instantaneous Reactive Power Theory for Three-Phase Power Systems; IEEE Transactions on Inshumentatien and Measurement; IEEE Service Center, Piscataway, NJ; Bd. 45; Nr. 1; ISSN: 0018-9456; XP011023999;; 1996.

*Primary Examiner* — Hoai-An D Nguyen
(74) *Attorney, Agent, or Firm* — Henry M. Feiereisen LLC

(57) ABSTRACT

In order to reliably determine the supply voltages ($U_i$) of the individual phases (L1, L2, L3) of a load (4) in a multiphase supply network (2), in particular a three-phase supply network, a measuring module (6) is provided and is used to determine the supply voltages ($U_i$) from measuring voltages ($U_{i,mess}$) with the aid of a matrix operation. The matrix operation is used, in particular, to compensate for potential differences or potential shifts between the measuring system and the supply network (2) without the need for hardware measures, for example a voltage transformer.

17 Claims, 2 Drawing Sheets

(51) Int. Cl.
*G01R 19/25* (2006.01)
*G01R 15/14* (2006.01)
*G01R 31/34* (2006.01)

(52) U.S. Cl.
CPC .......... *G01R 19/00* (2013.01); *G01R 19/0084* (2013.01); *G01R 31/343* (2013.01)

(58) Field of Classification Search
CPC .... G01R 19/25; G01R 19/2513; G01R 31/00; G01R 31/34; G01R 31/343; G01R 15/12; G01R 15/144
USPC .............. 324/76.11, 522, 713; 702/1, 57, 64
See application file for complete search history.

(56) References Cited

U.S. PATENT DOCUMENTS

| | | | |
|---|---|---|---|
| 2003/0189339 A1* | 10/2003 | Gupta | F01D 15/10 290/52 |
| 2007/0005194 A1* | 1/2007 | Chang | G01R 19/2513 700/292 |
| 2012/0150468 A1* | 6/2012 | Sahinoglu | G01R 19/2513 702/72 |
| 2016/0285273 A1* | 9/2016 | Leinonen | H02J 3/1842 |

* cited by examiner

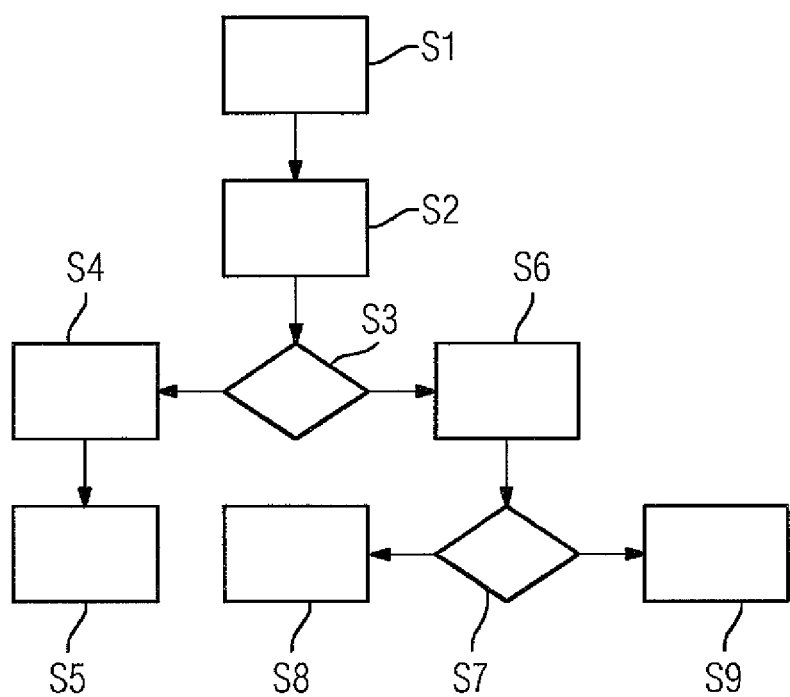

METHOD FOR DETERMINING THE SUPPLY VOLTAGES OF A LOAD, AND LOAD

CROSS-REFERENCES TO RELATED APPLICATIONS

This application is the U.S. National Stage of International Application No. PCT/EP2014/076438, filed Dec. 3, 2014, which designated the United States and has been published as International Publication No. WO 2015/086408 and which claims the priority of European Patent Application, Serial No. 13197203.6, filed Dec. 13, 2013, pursuant to 35 U.S.C. 119(a)-(d).

BACKGROUND OF THE INVENTION

The invention relates to a method for determining supply voltages of a load, and also a load.

In this regard, the load is a multiphase load, that is to say a load that is connected to a multiphase, in particular three-phase, supply network. In this regard, the supply network comprises a plurality of supply phases and also additionally, or respectively an additional, neutral conductor phase.

In the context of monitoring systems, for example for monitoring the condition of the load or also for monitoring energy consumption, electrical variables of the load are determined during operation. Parameters for maintenance or wear are then derived from these variables, for example in the context of condition monitoring. A fundamental variable in this regard is the supply voltage for the load. In the case of a three-phase supply network, the individual supply voltages of a respective phase typically have a phase relationship of 120°. The load usually comprises a plurality of sub loads that are suitably connected to the individual phases. The load is a three-phase electric motor for example, and the sub loads individual coils or groups of coils in that electric motor.

Measuring the voltage of loads of this type requires that the supply voltages of the individual phases be determined. To this effect, a voltage divider is usually assigned to each phase for the purpose of measuring voltage, the voltage dividers being wired up to a common measurement potential as a reference point.

In real-life systems, however, and depending on the current operating situations, the measured voltage of a respective phase measured in this way is not necessarily identical to the actual supply voltage applied to the (sub) load. Thus, for example, the respective supply voltage is also dependent, inter alia, on how and in what way the load is wired up to the supply network, whether this is by way of a so-called star connection or by way of a so-called delta connection, for example. In the first case, a voltage at the level of the voltage of the respective supply phase applies in each case, usually 230 Volt. In the case of a delta connection, a higher voltage, typically around 400 Volt, is applied to the sub load. At the same time, however, a measured voltage of only 230 Volt would be measured in each case.

In the presence of unsymmetrical loading of the various phases, this can moreover also result in shifts in the phase angle, likewise resulting in differences being produced. Ultimately, potential differences frequently exist between the measurement potential, that is to say the reference potential for the measured voltage and the network potential, that is to say the reference potential for the individual (sub) loads.

In addition to the three conductor phases of a three-phase supply network, an additional neutral conductor is also connected to the load in some systems, which in that case defines the network potential, that is to say the reference potential.

There are also characteristic differences in the definition of network reference potentials according to the country. In the USA, for example, the potential of one of the supply phases is also used as a reference potential.

Nowadays, so-called voltage transformers are employed to even out potential differences, which transformers are connected in series with the measuring system as hardware components to prevent incorrect measurements due to potential differences. Voltage transformers of this type are employed for measuring power in external measuring modules, for example. However, this is associated with a high level of cost in terms of hardware.

SUMMARY OF THE INVENTION

Taking this as a starting point, the object underlying the invention is to disclose a method with the aid of which, in a simple manner, the supply voltages of a load in a multiphase supply network are determined correctly in a simple manner.

According to one aspect of the invention, the object is achieved by a method for determining the supply voltages of a load with the aid of a measuring module, in particular for a condition or energy monitoring system, wherein the load is connected to a multiphase supply network with a plurality of phases, wherein a voltage is measured against a common measurement potential for each of the phases and in this regard a measured voltage is determined for each phase, wherein the supply voltages are determined from the measured voltages by means of a matrix mapping process with the aid of a correcting matrix.

According to another aspect of the invention, the object is achieved by a load, in particular an electric motor with an integrated measuring module for carrying out the method as set forth above.

In general, the method is used for determining the supply voltages of the load with the aid of a measuring module, in particular for a condition or energy monitoring system. In this regard, the load is connected to a multiphase, in particular three-phase, supply network which has a plurality of supply phases, referred to below as phases or conductor phases for short, to which the load is connected. For each of the phases, a respective voltage of the phase is measured against a common measurement and reference potential. In this regard, a measured voltage is determined for each phase. The respective supply voltage which is actually applied to the load or a respective sub load is determined from the as-measured measured voltages by means of a matrix construction process with the aid of a correcting matrix.

The basic idea of this concept can be seen in terms of not making provision for suitable potential references, e.g. by means of hardware measures, in order therefore to prevent potential differences between the measurement potential and the network reference potential for example, but instead to allow errors or incorrect synchronization of this type and undertake a correction in a purely computational manner. Hardware measures, such as the familiar voltage transformers for example, are therefore deliberately omitted. A potential difference between the measurement potential and the network potential, in particular, for the respective supply voltage of the respective (sub) load is therefore corrected and compensated for with the aid of the correcting matrix. This results overall in the hardware cost being kept low.

According to an appropriate development, different correcting matrices are used for different operating situations. Different operating situations mean both conditions of the respective load and also conditions, for example, of the supply network, or similarly different conditions due to the interaction of the load with the supply network. In this regard, these different correcting matrices are preferably deposited inside the measuring module and are suitably selected as function of the current operating situation in each case.

In this regard, the said selection preferably takes place automatically, i.e. the measuring module automatically detects a current operating situation and automatically selects from the deposited correcting matrices the matrix assigned to that operating situation.

In this regard, the method is preferably integrated permanently in the form of an algorithm in a semiconductor device containing an integrated circuit. This involves, for example, a specially designed ASIC chip.

Overall, the provision of different correcting matrices creates the possibility of reacting flexibly to different operating situations. The measuring module therefore has, overall, a certain intelligence and itself decides which correcting matrix needs to be used currently. Overall, this also allows a universally usable measuring module to be provided, which can be employed for the most varied applications, also in particular in different countries.

Appropriately, this measuring module with the specially designed semiconductor chip is, in this regard, directly integrated in to the respective load as a constituent of the said load and part of an integrated condition or energy monitoring system. In this regard, the different correcting matrices take account in particular of the following different operating situations:

the presence or connection of a neutral conductor at the measuring module, the existence of a potential difference between the measurement potential and the network potential, the integration of the load in to the supply network with a star connection, and also the integration of the load in to the supply network with a delta connection. A suitable, operating situation-specific correcting matrix is therefore used for each of these different operating situations.

Apart from this, further operating situations can be taken into account by means of further correcting matrices, such as an unsymmetrical loading of the individual phases of the supply network for example, in the event of the failure of a phase of the supply network for example, or even the use of the voltage of a supply phase as a reference or network potential etc.

In an appropriate embodiment in this regard, the current operating situation is determined and the assigned correcting matrix selected in the context of a measuring cycle. In this regard, the measuring cycle is preferably carried out repeatedly while the load is in operation. This takes place for example, but not necessarily, in periodic time intervals. In this regard, the time intervals lie in the range of a few seconds to some minutes, for example. This repeated measuring cycle therefore enables a permanent adjustment to the current operating condition in order to ensure that the monitoring of the load is as accurate as possible. As an alternative to this, there is the option of carrying out the measuring cycle each time the load is started up for example, that is to say whenever an electric motor is switched on for example.

In the case of high-performance electric motors, there is frequently a change-over between a low-load or start-up operation and a high-load or normal operation, the individual coils of the electric motor being connected together in a star connection in start-up operation and being connected together in a delta connection in normal operation for a higher level of power. In this regard, the change-over typically takes place by way of a motor control system and with the aid of a change-over signal. In general, therefore, the load is transposed from a first operating mode in to a second operating mode with the aid of this change-over signal. This change-over signal is captured simultaneously by the measuring module and a correcting matrix corresponding to the new operating mode, that is to say the new operating situation, is selected automatically.

According to a preferred embodiment variant, a neutral conductor voltage is measured—if the connection of a neutral conductor at the measuring module is detected—and the respective supply voltage determined from the difference between the respective as-measured measured voltage and the neutral conductor voltage for each phase with the aid of a first correcting matrix. In this regard, particularly simple use is made of the fact that the network potential is defined by way of the neutral conductor and therefore the actual supply voltage can be determined by a simple construction of the difference.

In an appropriate manner, there is in general an automatic checking process in the case of the measuring system described here as to whether a neutral conductor is connected. To this effect, a voltage level is checked at a neutral conductor input of the measuring module and the connection of a neutral conductor is confirmed if the voltage level applying at the neutral conductor input satisfies a predetermined condition. In particular, this condition is a function of the measured voltages. A neutral conductor is only confirmed in cases where, for example, the as-measured voltage level lies above a value as a function of the actual measured voltages. This decision as a function of the actual measured voltage is based on the consideration that in the case of high voltages on the various phases, a certain neutral conductor voltage is also to be expected. In particular, this reliably avoids an incorrect interpretation, so as not to decide incorrectly on the connection of a neutral conductor.

In the event, in particular, that no neutral conductor has been confirmed, then in an appropriate embodiment the supply voltage $U_i$ assigned to the respective measured voltage $U_{i,mess}$ is constructed from the difference between the respective measured voltage $U_{i,mess}$ and a mean value Q of the as-measured voltages $U_{i,mess}$ for each phase with the aid of a second correcting matrix, specifically $U_i = U_{i,mess} - Q$.

In this regard the mean value Q is preferably constructed from the quotient of the sum of the as-measured voltages $U_{i,mess}$ and the quantity A of phases, $Q = \Sigma U_{i,mess}/A$. This corresponds to the construction of the arithmetic mean.

In general terms, the mean value of the measured voltages ultimately maps a potential shift between the measurement potential and the network potential. The potential difference can therefore be seem as an error in the reference value of the measurement potential which is produced by the averaging of the three as-measured voltages. Since the voltages are in each case time-dependent voltages with a cosine profile, an automatic correction is additionally undertaken by means of this measure even in the presence of potential shifts (phase shifts) between the individual phases.

In an appropriate manner, the question of whether a potential shift of this type is to be taken into account is likewise determined automatically. In the case of some devices, a potential shift of this type can be ruled out by the special design of the device. By means of a corresponding device-specific identifier, which is communicated to the measuring module, a decision rule with regard to that correcting matrix can therefore be deposited by means of the identifier, as to whether the special correcting matrix is to be used or not. Alternatively or additionally, a decision rule of this type can also be determined with the aid of an algorithm. To this effect, voltage dividers of the measuring module are connected together in to a virtual star, for example, the star midpoint forming the common reference potential as in the case of a conventional star connection. If the measured voltages are identical (viewed in terms of amount), this points to there being precisely no potential shift, otherwise a potential shift between the individual phases can be assumed.

In an advantageous embodiment, at least one of the supply voltages $U_i$ determined is used for calculating the power of the multiphase load.

In general, the correcting matrix is preferably an mx(m+1) matrix, where m denotes the quantity of supply phases in the supply network. In the case of a three-phase supply network, therefore, the correcting matrix is realized in general in the form of a 3×4 matrix. With a general matrix of this type, the different operating situations can be mapped simply and aptly in the context of the inventive formal matrix system. The last column in the matrix is filled with zeroes in the case of a neutral conductor being absent, and with values in the case of a neutral conductor, in particular ones.

With regard to the different applications, different matrices are set forth below by way of example, and also the matrix mappings by way of example, for determining the individual supply voltages. In this regard, a three-phase supply network is assumed to which the load is connected. With regard to hybrid situations, the matrices are to be suitably adapted.

The measured voltages $U_{1,mess}$, $U_{2,mess}$, and $U_{3,mess}$ are assigned to the respective phases L1, L2, and L3. Furthermore, the voltage $U_{n,mess}$ is measured on the neutral conductor. The supply voltages $U_i = U_1$, $U_2$, and $U_3$ can therefore be represented in general terms in the form of a formal matrix system as follows:

$$\begin{bmatrix} U_1 \\ U_2 \\ U_3 \end{bmatrix} = \overline{M} \cdot \overline{U} = \begin{bmatrix} M_{11} M_{12} M_{13} M_{14} \\ M_{21} M_{22} M_{23} M_{24} \\ M_{31} M_{32} M_{33} M_{34} \end{bmatrix} \cdot \begin{bmatrix} U_{1,mess} \\ U_{2,mess} \\ U_{3,mess} \\ U_{4,mess} \end{bmatrix} \quad (G1)$$

a) Basic correcting matrix $M_0$ (without neutral conductor)

If the connection of a neutral conductor is not detected, then the matrix $\overline{M}$ can be represented as a basic correcting matrix $M_0$ as follows, in particular for a star connection:

$$\overline{M_0} = \begin{bmatrix} 1 & 0 & 0 & 0 \\ 0 & 1 & 0 & 0 \\ 0 & 0 & 1 & 0 \end{bmatrix} \quad (G2)$$

By way of advantage, the matrix elements "1" specified in the matrix $\overline{M}$ can also be replaced by another scaling factor. In this regard, the supply voltages $U_i$ are equated to the measured voltages $U_{i,mess}$ with this basic matrix $M_0$. This is valid if no potential differences or potential shifts are present.

An important aspect is that with the aid of the formal matrix system, it is possible to take into account an error that adapts in particular to potential differences, for example between the supply network, a voltage source, and the measuring system.

b) First correcting matrix $M_1$ (with neutral conductor)

To detect whether a neutral conductor is connected, the as-measured voltages are initially analyzed and the amount of the voltage on the neutral conductor compared by using the following formula:

$$|U_{n,mess}| \geq \max|U_{1,mess}; U_{2,mess}; U_{3,mess}| \cdot F \quad (G3)$$

In this regard, F represents a scaling factor. The voltages specified in formula G1 are time-dependent sine or cosine functions. The threshold can be defined by means of the combined effect of the as-measured voltages and scaled by using the error F. If the amount of $U_{n,mess}$ exceeds this scaled threshold value, then the connection of a neutral conductor is detected.

The supply voltage $U_{i,mess}$, for example $U_1$, i=1, is then rendered as:

$$U_1 = U_{1,mess} - U_{n,mess} \quad (G4)$$

The supply voltages $U_1$ and $U_2$ are constructed correspondingly. Proceeding from the basic correcting matrix, this therefore produces $\overline{M_1}$ as the first correcting matrix in the case of an neutral conductor being included:

$$\overline{M_1} = \begin{bmatrix} 1 & 0 & 0 & -1 \\ 0 & 1 & 0 & -1 \\ 0 & 0 & 1 & -1 \end{bmatrix}. \quad (G5)$$

c) Second correcting matrix $M_2$ (without neutral conductor, with potential difference)

In the event that a neutral conductor connection is not detected and a possible error, that is to say a potential difference or potential shift, is to be corrected, a potential error $U_{error}$ is initially defined as a mean value Q in accordance with the following formula:

$$U_{error} = \frac{U_{1,mess} + U_{2,mess} + U_{3,mess}}{3} \quad (G6)$$

This allows $U_i$ the first supply voltage that is assigned to the as-measured voltage $U_{1,mess}$, to be expressed as follows:

$$U_1 = U_{1,mess} - U_{Fekler} = U_{1,mess} - \frac{U_{1,mess} + U_{2,mess} + U_{3,mess}}{3} \quad (G7)$$

This produces a second correcting matrix $\overline{M_2}$ as follows, in particular for a star connection:

$$\overline{M_2} = \begin{bmatrix} 2/3 & -1/3 & -1/3 & 0 \\ -1/3 & 2/3 & -1/3 & 0 \\ -1/3 & -1/3 & 2/3 & 0 \end{bmatrix} \quad (G8)$$

A voltage transformer is therefore no longer needed.

d) Third correcting matrix $M_2$ (basic matrix for delta connection)

In the case of a delta connection of the load, the respective supply voltages $U_i$ can be determined from the measured voltages $U_{i,mess}$ according to the basic formula G1 specified above with the aid of the following third correcting matrix $M_2$:

$$\overline{M_2} = \begin{bmatrix} 1 & -1 & 0 & 0 \\ 0 & 1 & -1 & 0 \\ -1 & 0 & 1 & 0 \end{bmatrix} \quad (G10)$$

The third correcting matrix $M_2$ therefore maps a system with a delta connection without potential shift/potential differences. It is therefore to be seen as a basic matrix, just like the basic correcting matrix $M_a$, in which the supply voltages $U_i$ are determined first ($M_a$) for a star connection and then ($M_2$) for a delta connection. This is important in particular when there is a change over from a star connection to a delta connection in the case of a load.

In this regard, the change-over operation in the case of the load usually takes place with the aid of a contactor which is activated with the aid of a change-over signal. In the measuring system described here, this change-over signal is detected by the measuring module and an automatic change-over occurs between the two basic correcting matrices $M_5$ and $M_2$. Overall, therefore, this formal matrix system allows the outer conductor voltage, that is to say the actual supply voltage of the individual (sub) loads, to be determined from the measured voltages $U_i$ even for a delta connection.

Further advantageous embodiments and preferred developments of the inventions can be found in the description of the figures and/or the sub claims.

BRIEF DESCRIPTION OF THE DRAWING

In the following, the invention is described in detail and explained on the basis of the exemplary embodiments represented in the figures.

These show, in greatly simplified representations in each case, the following.

DETAILED DESCRIPTION OF PREFERRED EMBODIMENTS

Figure 1:
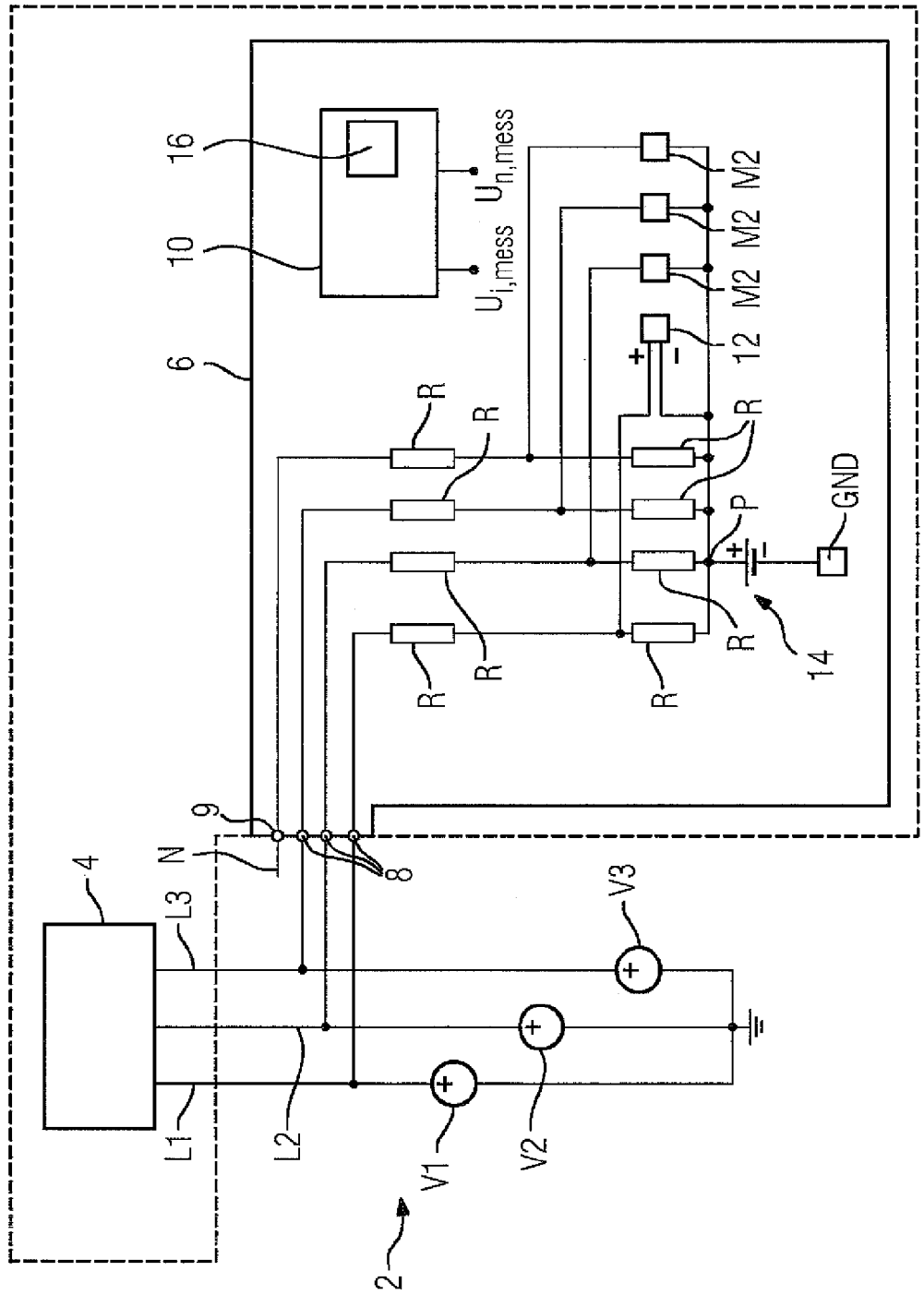
FIG. 1 a three-phase supply network with a connected load and with a measuring module, and also FIG. 2 a flow diagram to explain the method.

FIG. 1 shows a three-phase electricity or supply network to which a load 4 is connected. The supply network 2 is a three-phase supply network with three supply phases L1, L2, L3. Each supply phase L1, L2, L3 has a voltage source V1, V2, V3 assigned to it in each case.

Furthermore, FIG. 1 shows a measuring module 6 which is preferably integrated in to the load 4 as represented schematically in FIG. 1 by means of the broken line. The measuring module 6 has a total of three conductor inputs 8, and also a neutral conductor input 9, by way of which the measuring module can be connected to one of the phases L1, L2, L3 of the supply network 2 in each case and where appropriate to a neutral conductor N. In FIG. 1, the supply network 2 is shown without a neutral conductor N, the said neutral conductor merely being indicated by means of a broken line for illustrative purposes.

The load 4 is preferably an electric motor driven by three-phase current or some other load driven by three-phase current.

The measuring module 6 forms part of a monitoring system for monitoring and checking the load 4, in particular with regard to its condition, such as for example wear etc., in the context of a condition monitoring process and preferably, but also with regard to an energy monitoring process, to obtain information about energy, consumption and power of the load 4. To this effect, a respective supply voltage U1, U2, U3 is ascertained in a respective supply phase L1, L2, L3 with the aid of the measuring module 6. To this effect, for example, a measured voltage $U_{i,mess}$ is determined, i=1, 2, 3, for each individual supply phase L1, L2, L3 with the measuring circuit represented in the figures, and transmitted to an analysis unit 10 of the measuring module 6, in a first step. A supply voltage $U_i$ is then calculated for each phase L1, L2, L3 from these measured voltages $U_{i,mess}$ in the said analysis unit by means of the matrix operation described above.

To determine the measured voltages $U_{i,mess}$, each phase L1, L2, L3 is allocated a voltage divider constructed of two resistors R, between which a voltage tap takes place for a respective voltmeter 12. All the voltmeters 12 are connected to a common potential realized in the form of a measurement potential P.

In the exemplary embodiment, the measuring module 6 has its own voltage source 14 which defines the measurement potential P and is itself in turn grounded by being connected to ground potential GND. The measured voltages $U_{i,mess}$ measured by the voltmeters 12 are transmitted to the analysis unit 10 in a manner not represented here in detail. As with the connections of the conductor phases L1, L2, L3, the voltage level on the neutral conductor connection N is also tapped and the value measured by the voltmeter 12 is transmitted to the analysis unit 10 as the neutral conductor voltage $U_{n,mess}$.

The tapped voltages of the conductor phases L1, L2, L3, in the range 100 to around 700 Volt, for example, are fed back to the voltage level of the measuring system by way of the voltage dividers. Due to the individual voltage dividers being connected to the common measurement potential P, the said voltage dividers are more or less connected in a virtual star. In the exemplary embodiment, this voltage potential P is shifted by a fixed potential in relation to the ground potential GND due to the voltage source 14. The customarily star-shaped arrangement and the star-shaped connection of the load 4 are replicated with this measuring arrangement.

However, the as-measured voltages $U_{i,mess}$ only coincide with the actual supply voltages $U_i$ in strictly symmetrical operation, and in particular also only on the condition that there is no potential difference between the measurement potential P and a reference potential of the load 4 (network potential). Such potential differences are frequently present, however, and usually operation is not strictly symmetrical, i.e. the amplitudes of the voltages in the individual supply phases L1, L2, L3 are not identical and/or the phase relationships between the individual conductor phases L1, L2, L3 do not lie precisely 120° apart.

Due to the measuring module 6, errors of this type are, as described previously, compensated for exclusively by the matrix operations described. The values obtained for the supply voltages $U_i$ are then used for the monitoring system. The method for executing the matrix operation is implemented in the analysis unit 10. This is realized in particular in the form of an integrated circuit or includes such a circuit. In particular, the integrated circuit is a microchip or an Application-Specific Integrated Circuit (ASIC). The algorithm is therefore implemented permanently in the semiconductor structure of the integrated circuit. This integrated circuit is also referred to here as a "power ASIC" in order to indicate that in this instance the circuit is realized for measuring power for a monitoring system. A memory 16, in which different matrices M are deposited, is preferably also implemented in this integrated circuit.

For the purpose of ascertaining and determining the supply voltages $U_i$, a measuring cycle is carried out regularly, as explained below on the basis of FIGS. 2 and 3. The measuring cycle starts in the first step S1. This start-up is prompted, for example, by switching on the load 4 or at recurring time intervals while the load 4 is in operation. In the subsequent step S2, a voltage measurement takes place initially on the neutral conductor N. In step S3, a check is then performed as to whether the voltage value of the neutral conductor input 9 determined by the corresponding measuring module 12 is greater than a predetermined threshold. If so, a decision is made in step S4 that a neutral conductor N is present. In the next step S5, a selection of an assigned correcting matrix then takes place, for example the first correcting matrix $M_1$. In the following process, the determination of the value for the supply voltage $U_i$ for each phase is then determined continuously for the monitoring system, or at time intervals predetermined by the monitoring system, with the aid of the selected correcting matrix $M_n$.

If the threshold value interrogation in step S3 establishes that the amount of the as-measured neutral conductor voltage $U_{n,mess}$ falls below or does not reach the threshold value, then this is analyzed in step S6 to the effect that a neutral conductor N is not present.

In a further decision step S7, a check is then performed as to whether a potential shift should be compensated for. This decision is preset by means of a device-specific configuration, for example, that is to say it is decided in a device-dependent manner according to the implementation. If a potential shift is not to be taken into account, a conventional calculation takes place in step S8, for example by way of the correcting matrix $M_5$ in the case of a star connection or $M_2$ in the case of a delta connection. Alternatively, the decision rule as to whether a potential shift should be compensated for can also be decided by way of an algorithm. To this effect, for example, the as-measured individual measured voltages $U_{i,mess}$ are analyzed and a check is performed as to whether these are identical in terms of their amounts. If not, this is taken as an indication that there is a potential shift present.

If a potential shift is to be compensated for, then in step S9 the supply voltages $U_i$ are determined from the as-measured voltage values $U_{i,mess}$ by making use of a correspondingly selected correcting matrix, for example the second correcting matrix $M_2$.

What is claimed is:

1. A load, comprising:
   sub loads connected to a plurality of phases of a multiphase supply network in one-to-one correspondence; and
   an integrated measuring module configured to:
   measure a voltage against a common measurement potential for each of the phases to thereby determine a measured voltage for each phase;
   determine supply voltages from the measured voltages using a matrix mapping process with the aid of a correcting matrix;
   correct the presence of a potential difference for each of the supply voltages of a pertaining sub load; and
   compensate the potential difference.

2. The load of claim 1, constructed in the form of an electric motor with an integrated measuring module.

3. A method for determining supply voltages of a load using a measuring module, comprising:
   connecting a load to a multiphase supply network having a plurality of phases;
   measuring a voltage against a common measurement potential for each of the phases to thereby determine a measured voltage for each phase;
   determining supply voltages from the measured voltages using a matrix mapping process with the aid of a correcting matrix;
   correcting the presence of a potential difference for each of the supply voltages of a pertaining sub load; and
   compensating the potential difference.

4. The method of claim 3, for use in a condition or energy monitoring system.

5. The method of claim 3, further comprising using different correcting matrices for different operating situations.

6. The method of claim 5, further comprising storing the different correcting matrices within the measuring module, and selecting a respective one of the correcting matrices as a function of a current operating situation.

7. The method of claim 5, further comprising automatically identifying the different operating situations, and automatically using the correcting matrices respectively assigned to the operating situations to construct a matrix.

8. The method of claim 7, further comprising determining, in the context of a measuring cycle, the operating situation and selecting the one of the correcting matrices assigned to the operating situation for constructing the matrix, and reiterating the measuring cycle repeatedly.

9. The method of claim 8, wherein the measuring cycle is reiterated in an interval of a few seconds, while the load is in operation.

10. The method of claim 3, further comprising selecting as a function of a change-over signal, which transfers the load from a first operating mode into a second operating mode, a respective one of the correcting matrices assigned to a respective one of the operating modes.

11. The method of claim 10, further comprising selectively operating the load in a connection selected from the group consisting of star connection and a delta connection, as a function of the change-over signal, and selecting a respective one of the correcting matrices assigned to the connection.

12. The method of claim 3, further comprising measuring a neutral conductor voltage, when a connection of a neutral conductor is detected, and determining a respective one of the supply voltages from a difference between the measured voltage and the neutral conductor voltage for each phase, using a first correcting matrix in accordance with $U_i = U_{i,mess} - U_{n,mess}$, wherein $U_i$ is the supply voltage, $U_{i,mess}$ is the measured voltage, and $U_{n,mess}$ is the neutral conductor voltage.

13. The method of claim 3, further comprising automatically confirming a connection of a neutral conductor as a function of a value of a voltage applied at a neutral conductor input of the measuring module.

14. The method of claim 3, wherein the supply voltage assigned to a respective one of the measured voltages is constructed from a difference between the respective one of the measured voltages and a mean value of the measured voltages for each phase, using a second correcting matrix in accordance with $U_i = U_{i,mess} - Q$, wherein $U_i$ is the supply voltage, $U_{i,mess}$ is the respective one of the measured voltages, and Q is the mean value.

15. The method of claim 14, wherein the mean value is constructed from a quotient of a sum of the measured voltages divided by a quantity of the measured voltages in accordance with $Q=\Sigma U_{i,mess}/A$, wherein A is the quantity of the measured voltages.

16. The method of claim 3, wherein at least one of the supply voltages is used for calculating a power of the load.

17. The method of claim 3, wherein the correcting matrix is realized in the form of a 3×4 matrix, when a three-phase supply network is involved.

* * * * *